United States Patent [19]

Puester et al.

[11] Patent Number: 5,469,083

[45] Date of Patent: Nov. 21, 1995

[54] CIRCUIT CONFIGURATION FOR SYNCHRONOUS CLOCK GENERATION OF AT LEAST TWO CLOCK SIGNALS

[75] Inventors: Harald Puester, Erkrath; Hans-Gerd Kirchhoff, Ratingen, both of Germany

[73] Assignee: Siemens Aktiengesellschaft, Munich, Germany

[21] Appl. No.: 340,259

[22] Filed: Nov. 16, 1994

[30] Foreign Application Priority Data

Nov. 16, 1993 [DE] Germany .................. 43 39 159.1

[51] Int. Cl.⁶ .................. H03K 19/00; H03L 7/00
[52] U.S. Cl. .................. 326/93; 327/155; 327/295
[58] Field of Search .................. 326/93; 327/155, 327/295

[56] References Cited

U.S. PATENT DOCUMENTS

| | | | |
|---|---|---|---|
| 3,783,254 | 1/1974 | Eichelberger | 326/93 |
| 4,317,053 | 2/1982 | Shaw et al. | 327/155 |
| 4,349,754 | 9/1982 | Bull | 327/155 |
| 4,398,103 | 8/1983 | Derzawiec et al. | 326/93 |
| 4,855,681 | 8/1989 | Millham | 327/295 |
| 4,866,310 | 9/1989 | Ando et al. | |
| 5,122,679 | 6/1992 | Ishii et al. | |
| 5,329,240 | 7/1994 | Kubota et al. | |

OTHER PUBLICATIONS

Patent Abstracts of Japan, vol. 13, No. 433 (E–824) Sep. 27, 1989 & JP–A–1–161912 (Toshiba) Jun. 26, 1989.

*Primary Examiner*—Edward P. Westin
*Assistant Examiner*—Richard Roseen
*Attorney, Agent, or Firm*—Herbert L. Lerner; Laurence A. Greenberg

[57] ABSTRACT

A circuit configuration for synchronous clock generation of at least two clock signals, includes an enable stage for receiving a clock signal and enabling the clock signal under the control of an enable signal. A branching stage for receiving the enabled clock signal from the enable stage generates at least two clock signals from the enabled clock signal. Logic and/or driver stages are each connected downstream of the branching stage for receiving a respective one of the clock signals generated by the branching stage. Each of the logic and/or driver stages has an output at which a respective output clock signal can be picked up. Amplifiers are each connected to the output of a respective one of the other stages and are associated with a respective one of the output clock signals, for detecting edges of the output clock signals. A logic array connected to the amplifiers logically links the output signals generated by the amplifiers. The logic array generates the enable signal for controlling the enable stage.

5 Claims, 1 Drawing Sheet

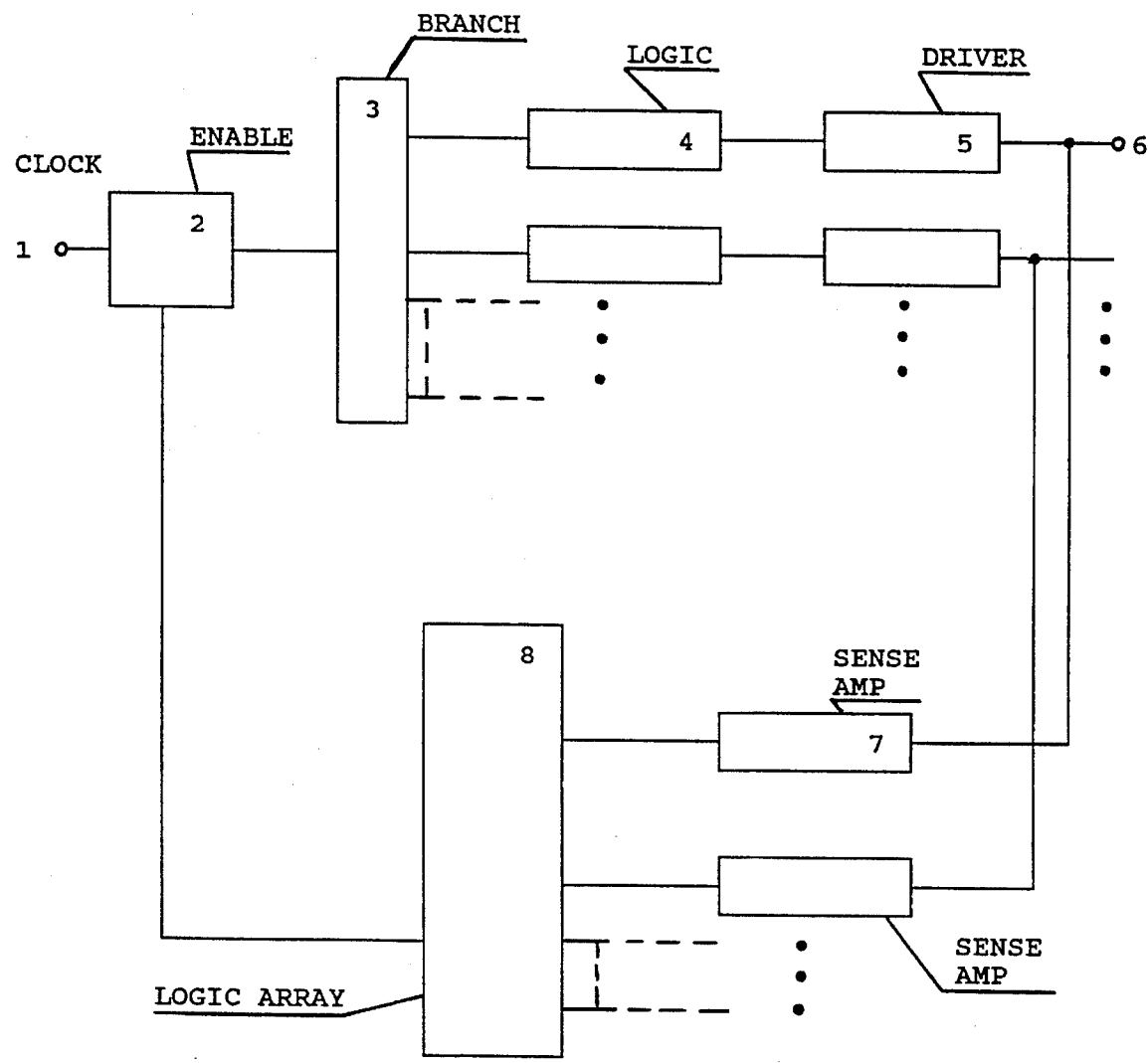

CIRCUIT CONFIGURATION FOR SYNCHRONOUS CLOCK GENERATION OF AT LEAST TWO CLOCK SIGNALS

BACKGROUND OF THE INVENTION

1. Field of the Invention

The invention relates to a circuit configuration for synchronous clock generation of at least two clock signals.

In modern construction techniques, microcontrollers are distinguished by a modular construction. The various components are separated from one another as much as possible. Among other things, that affects the clock pulse and particularly the clock generation, since different turn-on and turn-off conditions apply, for instance, and therefore there is not merely one single-phase or multiphase clock system, but usually more than one of them, distributed in blocks, on the integrated circuit. However, with that kind of procedure, assurance must be provided that the individual clock systems will not shift unintentionally relative to one another, which is a phenomenon also known by the term "clock skewing".

Heretofore known clock generating circuits begin with a central single-phase clock pulse, which is derived more or less directly from the clock signal supplied to the chip. The signal is then split, and the resultant clock pulses are linked by combinatorial logic and finally fed to an output driver. Clock skewing is minimized by suitable dimensioning of the output drivers, which are adapted to the current or present capacitive load.

In Patent Abstracts of Japan, Section E, Vol. 13 (1989), No. 433 (E-824), JP-1-161912, a clock generating circuit is shown in which various circuit blocks each have one clock input buffer that furnishes clock signals for that circuit block. The clock input buffers are supplied with a common input clock signal. They have a time lag that is adjustable in each case through a shift register. The delay value that is adjustable through the shift registers can be supplied externally.

However, that kind of clock generation has several disadvantages. First, it is highly dependent on the dimensions of the output drivers, which can vary during manufacture if great process fluctuations occur. Second, it is not possible to control or monitor the clock skewing.

SUMMARY OF THE INVENTION

It is accordingly an object of the invention to provide a circuit configuration for synchronous clock generation of at least two clock signals, which overcomes the hereinafore-mentioned disadvantages of the heretofore-known devices of this general type.

With the foregoing and other objects in view there is provided, in accordance with the invention, a circuit configuration for synchronous clock generation of at least two clock signals, comprising an enable stage for receiving a clock signal and enabling the clock signal under the control of an enable signal; a branching stage for receiving the enabled clock signal from the enable stage and generating at least two clock signals from the enabled clock signal; logic and/or driver stages each being connected downstream of the branching stage for receiving a respective one of the clock signals generated by the branching stage, each of the logic and/or driver stages having an output at which a respective output clock signal can be picked up; amplifiers each being connected to the output of a respective one of the logic and/or driver stages and being associated with a respective one of the output clock signals, for detecting edges of the output clock signals; and a logic array connected to the amplifiers for logical linking of the output signals generated by the amplifiers, the logic array generating the enable or control signal for controlling the enable stage.

In accordance with a concomitant feature of the invention, the amplifiers have an operating point located near a negative supply potential of a supply voltage.

Other features which are considered as characteristic for the invention are set forth in the appended claims.

Although the invention is illustrated and described herein as embodied in a circuit configuration for synchronous clock generation of at least two clock signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a block circuit diagram of a configuration according to the invention.

DESCRIPTION OF THE PREFERRED EMBODIMENTS

Referring now to the single FIGURE of the drawing in detail, there is seen an input terminal 1, to which a clock signal, that deliverable from outside, for instance, can be delivered. Reference numeral 2 indicates a so-called enable stage, by means of which an actual synchronization of the clock signals takes place. For that purpose, the enable stage 2 has a control input. In the simplest case, the enable stage 2 may be constructed as a logic gate, such as an AND gate, having one input which is supplied with the clock signal and another input which is supplied with the control signal.

An output of the enable stage 2 is connected to a branching stage 3, which serves to generate a plurality of clock signals from the clock signal supplied to it. For the sake of simplicity, only one circuit branch for generating the output clock signals will be described. This branch may, for instance, include a combinatorial logic circuit or stage 4 and/or a following driver stage 5. The actual output clock signal can be picked up at an output of the driver stage 5 through an output terminal 6. A pickup leads from this output terminal 6 to an input of an amplifier 7, which serves as a "sense amplifier". The amplifier 7 has a low operating point, for instance, which is close to a negative supply potential of a supply voltage. An output signal of this amplifier 7 is supplied to one input of a logic array 8. The logic array 8 has a number of inputs, depending on the number of clock signals to be produced. An output signal of the logic array 8 is utilized to control the enable stage 2. In the simplest case, a NAND gate, for instance, with a number of inputs corresponding to the number of clock signals, may be provided as the logic array 8.

The entire configuration of FIGURE 1 forms a synchronization circuit, which avoids clock skewing by means of a simple locking mechanism. To that end, the various clock pulses that are generated are picked up downstream of the output drivers or driver stage 5, or in other words at a point where the clock skewing can occur as a result of load fluctuations. This pickup is delivered to the sense amplifier 7 which, due to its low operating point, assures a process-independent delay in the switchover time relative to the external wiring. Subsequently, linking of the various output signals of the sense amplifier 7 takes place along with a return to the clock pulse supplied through the input terminal 1. If a NAND gate is used as mentioned above, then its output is not switched to logical "0" until all of the inputs are at logical "0". It is only then that the clock pulse is enabled through the enable stage 2.

It is thus attained that all of the clock pulses must first switch to a deactivated low state before a change to the active state is possible. Due to the synchronization, the edge toward the active state is at virtually the same instant for all clock pulses. Naturally, the circuit may also be constructed in such a way that synchronization is performed to the trailing edge of the clock signal.

We claim:

1. A circuit configuration for synchronous clock generation of at least two clock signals, comprising:

an enable stage for receiving a clock signal and enabling the clock signal under the control of an enable signal;

a branching stage for receiving the enabled clock signal from said enable stage and generating at least two clock signals from the enabled clock signal;

other stages each being connected downstream of said branching stage for receiving a respective one of the clock signals generated by said branching stage, each of said other stages having an output at which a respective output clock signal can be picked up;

amplifiers each being connected to the output of a respective one of said other stages and being associated with a respective one of the output clock signals, for detecting edges of the output clock signals; and a logic array connected to said amplifiers for logical linking of the output signals generated by said amplifiers, said logic array generating the enable signal for controlling said enable stage.

2. The circuit configuration according to claim 1, wherein said other stages are logic stages.

3. The circuit configuration according to claim 1, wherein said other stages are driver stages.

4. The circuit configuration according to claim 1, wherein said other stages are logic stages and driver stages.

5. The circuit configuration according to claim 1, wherein said amplifiers have an operating point located near a negative supply potential of a supply voltage.

* * * * *